(12) United States Patent
Ferrant et al.

(10) Patent No.: US 9,251,871 B2
(45) Date of Patent: Feb. 2, 2016

(54) SENSE AMPLIFIER WITH DUAL GATE PRECHARGE AND DECODE TRANSISTORS

(71) Applicant: SOITEC, Bernin (FR)

(72) Inventors: Richard Ferrant, Esquibien (FR); Joerg Vollrath, Olching (DE); Roland Thewes, Kleinmachnow (DE); Wolfgang Hoenlein, Unterhaching (DE); Hofmann Franz, Munich (DE); Gerhard Enders, Olching (DE)

(73) Assignee: Soitec (FR)

( * ) Notice: Subject to any disclaimer, the term of this patent is extended or adjusted under 35 U.S.C. 154(b) by 0 days.

(21) Appl. No.: 14/358,193

(22) PCT Filed: Nov. 14, 2012

(86) PCT No.: PCT/EP2012/072549
§ 371 (c)(1),
(2) Date: May 14, 2014

(87) PCT Pub. No.: WO2013/072331
PCT Pub. Date: May 23, 2013

(65) Prior Publication Data
US 2014/0321225 A1      Oct. 30, 2014

(30) Foreign Application Priority Data
Nov. 15, 2011   (FR) .................................... 11 60396

(51) Int. Cl.
| | | |
|---|---|---|
| G11C 7/02 | (2006.01) | |
| G11C 7/06 | (2006.01) | |
| G11C 7/08 | (2006.01) | |
| G11C 7/12 | (2006.01) | |
| G11C 11/4091 | (2006.01) | |
| G11C 11/4094 | (2006.01) | |

(52) U.S. Cl.
CPC ...... *G11C 7/06* (2013.01); *G11C 7/065* (2013.01); *G11C 7/08* (2013.01); *G11C 7/12* (2013.01); *G11C 11/4091* (2013.01); *G11C 11/4094* (2013.01); *G11C 2207/002* (2013.01)

(58) Field of Classification Search
USPC ................... 365/210.1, 207, 205, 203, 185.23
See application file for complete search history.

(56) References Cited

U.S. PATENT DOCUMENTS 6,052,324 A * 4/2000 Tobita ........................... 365/207
7,304,903 B2 * 12/2007 Mukhopadhyay et al. ... 365/205

(Continued)

FOREIGN PATENT DOCUMENTS

| FR | 2911004 A1 | 7/2008 |
|---|---|---|
| FR | 2972838 | 8/2012 |
| FR | 2974656 A1 | 11/2012 |

OTHER PUBLICATIONS

French Search Report for Application No. FR 1160396 dated Apr. 3, 2012.

(Continued)

*Primary Examiner* — Anthan Tran
(74) *Attorney, Agent, or Firm* — Lerner, David, Littenberg, Krumholz & Mentlik, LLP

(57) ABSTRACT

The invention relates to a sense amplifier for sensing and amplifying data stored in a memory cell, the sense amplifier being connected between a bit line (BL) and a reference bit line complementary (/BL) to the first bit line and comprising: a sense circuit (SC) capable of providing an output indicative of the data stored in the memory cell; and a precharge and decode circuit (PDC) comprising a pair of dual gate transistors (T5, T6) for precharging the first and second bit lines during a precharge operation and for transferring the output provided by the sense circuit to a data line (LIO,/LIO) during a read operation.

14 Claims, 4 Drawing Sheets

(56) References Cited

U.S. PATENT DOCUMENTS 8,399,316 B2 * 3/2013 Vinet et al. .................. 438/157
2010/0178743 A1 7/2010 Vinet et al.
2012/0275253 A1 11/2012 Ferrant et al.

OTHER PUBLICATIONS

International Search Report for Application No. PCT/EP2012/072549 dated Feb. 19, 2013.

* cited by examiner

SENSE AMPLIFIER WITH DUAL GATE PRECHARGE AND DECODE TRANSISTORS

CROSS-REFERENCE TO RELATED APPLICATION

The present application is a national phase entry under 35 U.S.C. §371 of International Application No. PCT/EP2012/072549, filed Nov. 14, 2012, which claims the benefit of priority to French Patent Application No. 1160396, filed Nov. 15, 2011, the disclosure of which is incorporated herein by reference.

FIELD OF THE INVENTION

The invention relates generally to a semiconductor memory, such as a Dynamic Random Access Memory (DRAM), and more particularly to a sense amplifier for sensing and amplifying data stored in a plurality of memory cells of a memory cell array.

BACKGROUND OF THE INVENTION

Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

To read data out of a cell, the capacitor of a cell is accessed by selecting the word line associated with the cell. A complementary bit line that is paired with the bit line for the selected cell is equilibrated to an equilibrium voltage. This equilibration voltage (Veq) is typically midway between the high Vdd and low Vss (typically ground) logic levels. Thus, conventionally, the bit lines are equilibrated to one-half of the power supply voltage, Vdd/2. When the word line is activated for the selected cell, the capacitor of the selected cell discharges the stored voltage onto the bit line, thus changing the voltage on the bit line. A differential amplifier, conventionally referred to as a sense amplifier, is then used to detect and amplify the difference in voltage on the pair of bit lines.

In order to comply with area constraints of a memory, a stacking technique, so-called "staggering" technique, is conventionally used to take into account the pitch difference in between the sense amplifier and the cells. Several sense amplifiers are therefore staggered one behind each other in the longitudinal direction of the bit lines. However, this architecture suffers that a bit line and its complementary run over all the staggered sense amplifiers. This leads to a congestion of the space available as metal-0 (metal used for the bit lines) indeed covers 100% of the sense amplifiers. Moreover, addressing a specific cell of the memory necessitates row and column address buses built from metal tracks, generally metal-1 tracks. When 64 column address buses are used to decode the sense amplifiers of the sense amplifier array, around 100 metal-1 tracks need to be present for power supplies, control commands, I/Os and decoding (64 tracks for this latest group). But in the near future, there needs to be a lot of focus of the core circuits of a DRAM, especially on the sense amplifier. Indeed, with introduction of FDSOI (Fully Depleted Silicon On Insulator) technology or introduction of high-k/metal gate, devices will get smaller and the metal lines could become the limiting factor, not any more the size of the devices. It is therefore understood that 100 metal-1 tracks are far too many.

FIG. 1 shows a memory architecture that helps limiting the available space congestion by dividing the memory cells array into sub-arrays MC0, MC1, MC2, MC3, by splitting the sense amplifiers into pairs of staggered sense amplifier banks and by providing the bit lines according to an interleaved arrangement so that they alternate in the lateral direction of the word lines WL between a bit line BL0, BL2 coupled to a sense amplifier SA0, SA2 of the first bank of the pair and a bit line BL1, BL3 coupled to a sense amplifier SA1, SA3 of the second bank of the pair. The alternative arrangement of the bit lines result in interconnect spaces available in each sense amplifier bank of the pair parallel to the bit lines. With this alternative arrangement, metal-0 now covers only 50% of the sense amplifiers. With relaxed constraints on the sense amplifiers, the layout is easier.

On FIG. 1, only relevant signals are represented for clarity:

Row decode signals $\phi_{PCH}$ running in the X direction and using metal-1 are used to address a line of sense amplifiers;

Column decode signals running on CoLumn Select lines (CSLi, CSLj) in the Y direction (column decode) and using metal-2 are used to address a column of sense amplifiers;

Local Input/Output lines (LIO and its complementary $\overline{LIO}$) using metal-1 are used to transfer the data sensed and amplified from the sense amplifiers to Global Input/Output lines (GIOm, GIOn and their complementary $\overline{GIOm}$, $\overline{GIOn}$) running perpendicularly to the Local Input/Output lines and using metal-2. The length of the Local Input/Output lines (i.e. number of sense amplifiers tied on) depends on layout constraints, staggering, metal-2 pitch rules, circuit specification, etc.

Each CoLumn Select line (CSLi, CSLj) decodes a column of sense amplifiers in banks that are on the path. The selected sense amplifiers SA0, SA1, SA2, SA3 provide a valid behavior (read or write), while the half selected ones SA4, SA5 remain in HZ state (high impedance) and do not disturb the Global Input/Output lines except for being extra parasitics to be loaded/unloaded.

The data present on the Global Input/Output lines enters into all the Local Input/Output lines and therefore a precharge has to be done at the beginning of the following access to insure proper sensing and refresh. It cannot be anticipated. Considering the number of sense amplifiers and the total metal length (Global and Local Input Output lines), a significant power can be dissipated then.

In addition, a conventional sense amplifier fabricated in bulk silicon CMOs technology is made of eleven transistors and thus increases the surface area of the entire circuit.

Several solutions are possible to overcome the parasitic issues and possible power peaks.

According to a first solution, a local decoder (references to as switch S on FIG. 1) can be added between Local I/O lines and Global I/O lines. In that case, the unselected Local I/O lines remain undisturbed by the Global I/O lines and can be precharged in advance allowing very fast cycle times.

According to a second solution, a decoder, that can be as simple as for instance a NOR or a NAND gate, can be added between a CoLumn Select line and the row decode signal $\phi_{PCH}$. With this second solution, the content of the half-selected sense amplifiers remains unaffected by the Local I/O lines. The load along the CoLumn Select lines can also be reduced (the decoder being used as a local signal booster) while the cycle time may be improved. This second solution is in particular described in the French patent application no 1152256 filed by the Applicant on Mar. 18, 2011 and not yet published.

Both first and second solutions can be applied simultaneously which afford for very good performances but may not be optimal on the layout point of view. Indeed, the only possible location for these decoders is immediately next to the sense amplifiers (or even into the sense amplifier layout) which introduces an "irregular" layout in a very sensitive region.

SUMMARY OF THE INVENTION

The invention aims at providing a semiconductor memory that does not suffer from the above mentioned drawbacks, and in particular a semiconductor memory wherein the sense amplifiers are introduced without particular layout constraint and without area penalty.

In this respect, the invention proposes according to its first aspect a sense amplifier for sensing and amplifying data stored in a memory cell, the sense amplifier being connected between a bit line and a reference bit line complementary to the first bit line and comprising:

a sense circuit capable of providing an output indicative of the data stored in the memory cell; and a precharge and decode circuit comprising a pair of dual gate transistors for precharging the first and second bit lines during a precharge operation and for transferring the output provided by the sense circuit to a data line during a read operation.

Other preferred, although non limitative, aspects of this memory are as follows:

each dual gate transistor of the precharge and decode circuit has a first gate and a second gate, the first gates of the dual gate transistors being both controlled by a decoding control signal and the second gates of the dual gate transistors being both controlled by a precharge control signal;

each dual gate transistor is capable of working in either depletion or enhancement mode with respect to the state of the first gate of the transistor controlled by the decoding control signal depending on the state of the second gate of the transistor controlled precharge control signal;

each dual gate transistor is capable of working in depletion mode when the precharge control signal is at a ON state, and capable of working in enhancement mode when the precharge control signal is at a OFF state;

the sense amplifier is made on a semiconductor-on-insulator substrate comprising a thin layer of semiconducting material separated from a substrate by an insulating layer, and the dual gate transistors each comprise a first and a second gate, one of which is a back gate formed in the substrate below the insulating layer;

the second gate of each dual gate transistor is a back gate formed in the substrate below the insulating layer;

each dual gate transistor is a Fin-type independent double gate transistor;

each dual gate transistor is made of two single gate transistors arranged in parallel;

the precharge and decode circuit comprises a single pair of dual gate transistors;

each dual gate transistor is arranged in series between one of the bit line and the reference bit line and a corresponding one of a first and a second data lines;

the sense amplifier is made on a semiconductor-on-insulator substrate comprising a thin layer of semiconducting material separated from a substrate by an insulating layer, and the sense circuit comprises a pair of cross-coupled inverters arranged between the first and second bit lines, and the cross-coupled inverters comprises dual gate transistors each having a first and a second gate, one of which is a back gate formed in the substrate below the insulating layer;

the sense circuit consists in the pair of cross-coupled inverters and in a further equalization transistor.

According to another aspect, the invention relates to a semiconductor memory comprising at least one array of memory cells arranged in rows and columns and at least one sense amplifier according to the first aspect of the invention.

According to yet another aspect, the invention relates to a method of operating a sense amplifier according to the first aspect of the invention.

BRIEF DESCRIPTION OF THE DRAWINGS

Other aspects, goals and advantages of the invention will become more apparent upon reading the following detailed description of preferred embodiments thereof, given by way of examples and with reference to the accompanying drawings upon which.

DETAILED DESCRIPTION OF PREFERRED EMBODIMENTS OF THE INVENTION

Figure 1:
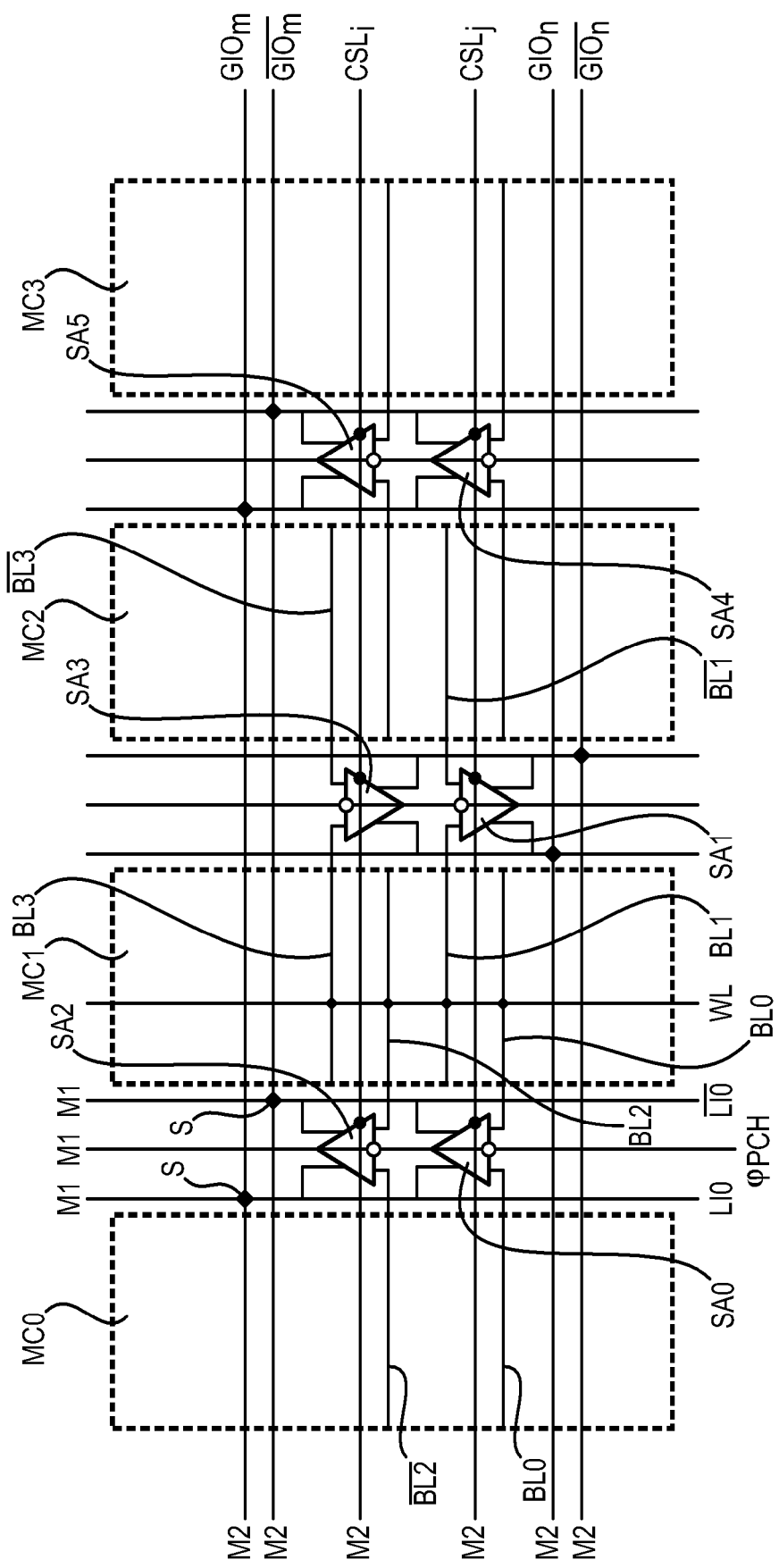
FIG. 1 already discussed above shows a conventional DRAM architecture.
Figure 2:
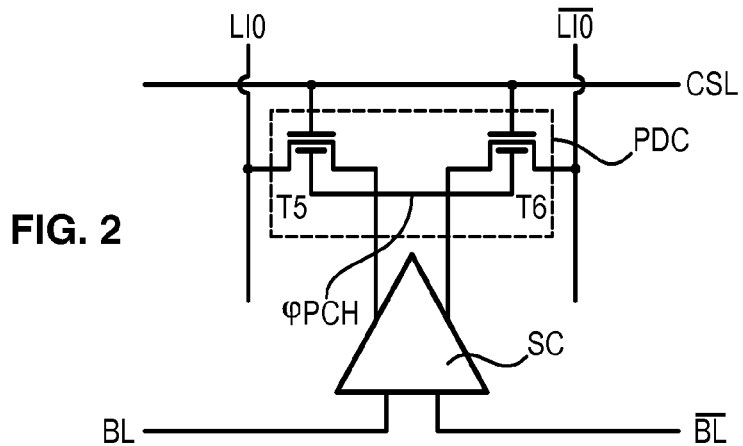
FIG. 2 is a diagram showing a sense amplifier according to the first aspect of the invention.

With reference to FIG. 2, the invention concerns in its first aspect a sense amplifier for sensing and amplifying data stored in a memory cell, the sense amplifier being connected between a bit line BL and a reference bit line $\overline{BL}$ complementary to the bit line and comprising:

a sense circuit SC capable of providing an output indicative of the data stored in the memory cell; and a precharge and decode circuit PDC comprising a pair of dual gate transistors T5, T6 for precharging the first and second bit lines during a precharge operation and for transferring the output provided by the sense circuit to a data line LIO, $\overline{LIO}$ during a read operation.

In a preferred embodiment shown on FIG. 2, the precharge and decode circuit PDC consists of a single pair of dual gate transistors T5, T6.

Each dual gate transistor T5, T6 of the precharge and decode circuit PDC is arranged in series between the sense circuit SC and one of a first data line LIO and a second data line $\overline{LIO}$ complementary to the first data line. They are more particularly arranged in series between one of the bit line BL and the reference bit line $\overline{BL}$ and a corresponding one of the first and second data lines LIO, $\overline{LIO}$.

The sense circuit SC is classically arranged in between the bit lines BL, $\overline{BL}$ is to detect and amplify the difference in voltage on the pair of bit lines.

Each dual gate transistor T5, T6 of the precharge and decode circuit PDC has a first and a second gate, the first gates of the dual gate transistors being both controlled by a decoding control signal CSL and the second gates of the dual gate transistors being both controlled by a precharge control signal $\phi_{PCH}$.

Each dual gate transistor T5, T6 is capable of working in either depletion or enhancement mode, with respect to the state of the first gate operated by the decoding control signal CSL, depending on the state of the second gate operated by the perpendicular precharge control signal $\phi_{PCH}$.

Considering Nchannel transistors, each dual gate transistor T5, T6 is more precisely capable of working in depletion mode with respect to the first gate operated by the decoding control signal CSL when the precharge control signal $\phi_{PCH}$ is at a high state (such as high state Vdd), and capable of working in enhancement mode when the precharge control signal is at a low state (such as low state GND).

It will be noted that within the claims, the term "ON state" is preferred to "high state" and the term "OFF state" is preferred to "low state" as the concept high/low is fine for Nchannel transistors but inverted for Pchannel transistors.

According to a first embodiment, the sense amplifier is made on a semiconductor-on-insulator substrate, such as a silicon-on-insulator substrate, comprising a thin layer of semiconducting material separated from a substrate by an insulating layer. The dual gate transistors T5, T6 each comprise a first and a second gates, one of which is a back gate formed in the substrate below the insulating layer. The second gate of each dual gate transistors is preferably such a back gate which is thereby controlled by the precharge control signal $\phi_{PCH}$.

According to another embodiment, each dual gate transistor T5, T6 is a Fin-type independent double gate transistor.

According to yet another embodiment, each dual gate transistors T5, T6 is made of two single gate transistors arranged in parallel.

Figure 3:
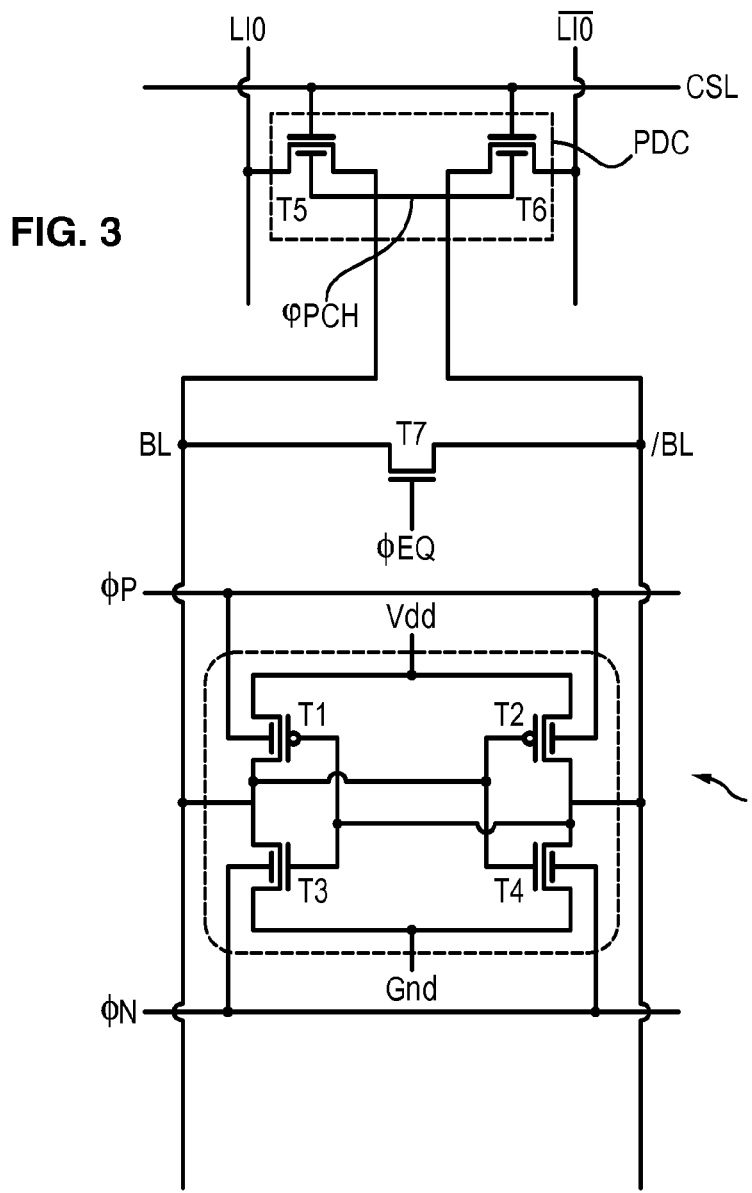
FIG. 3 shows a possible embodiment of a sense amplifier according to the first aspect of the invention.

Although the invention is in no way limited to a particular sense circuit, FIG. 3 shows a preferred embodiment of the present invention wherein the sense circuit SC of the sense amplifier comprises a pair of cross-coupled inverters T1, T3; T2, T4 arranged between the bit line BL and the reference bit line $\overline{BL}$. The cross-coupled inverters comprise dual gate transistors T1-T4 each having a first and a second gates. Transistors T1, T2 are usually referred to as pull-up transistors, while transistors T3, T4 are usually referred to as pull-down transistors. The second gates of the pull-up transistors T1, T2 are controlled by a pull-up second control signal $\Phi_P$, while the second gates of the pull-down transistors T3, T4 are controlled by a pull-down second control signal $\Phi_N$. The sense circuit may further comprise an equalization transistor T7 arranged in between the bitlines BL, $\overline{BL}$ and having its gate controlled by an equalization control signal $\phi_{EQ}$.

The sense amplifier of FIG. 3 is preferentially made on a semiconductor-on-insulator substrate comprising a thin layer of semiconducting material separated from a substrate by an insulating layer, and the second gates of transistors T1-T4 are back gates formed in the substrate below the insulating layer.

It will be appreciated that this preferred embodiment is described in the French patent application no 1153573 filed by the Applicant on Apr. 26, 2011 and not yet published.

Figure 4:
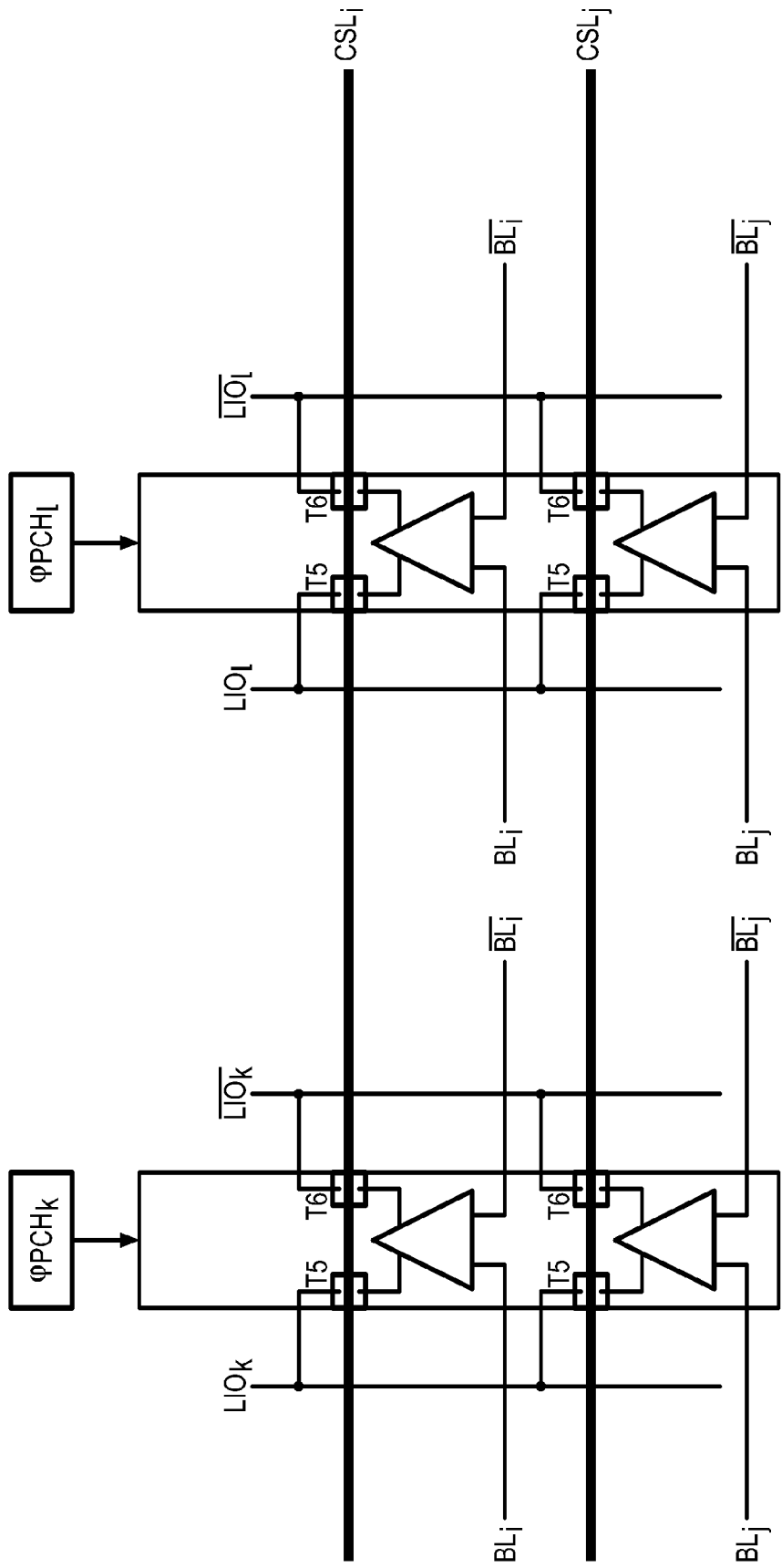
FIG. 4 is a diagram showing the topological arrangement of sense amplifiers according to the first aspect of the invention.

FIG. 4 shows the topological arrangement of sense amplifiers according to the first aspect of the invention in a semiconductor memory. On FIG. 4, indicia k and l represent two rows, while indicia i and j represents two columns. The precharge control signals $\phi_{PCH_k}$, $\phi_{PCH_l}$ to be applied to the second gates (for instance back gates) of transistors T5 and T6 of the sense amplifiers arranged on rows k and l respectively run on precharge lines which are typically in metal-1. The decoding control signal CSLi, CSLj to be applied to the first gates of transistors T5 and T6 of the sense amplifiers arranged on columns i and j run on decoding lines which are typically in metal-2. The decoding lines and the precharge lines are advantageously perpendicular to each other, with the decoding line preferably arranged in the bit line direction of the memory cells array and the precharge line arranged in the direction perpendicular to the bit line direction.

Figure 5:
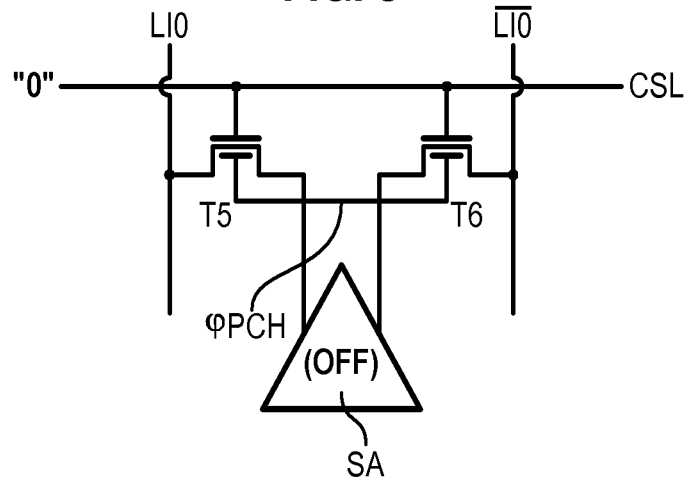
FIGS. 5, 6 and 7 show the method of operating the sense amplifier according to the first aspect of the invention to perform the operations of precharge, sense and decode.
Figure 6:
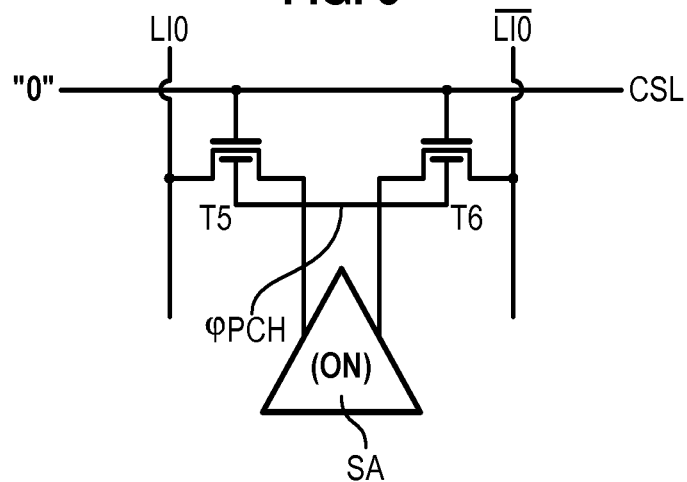
Figure 7:
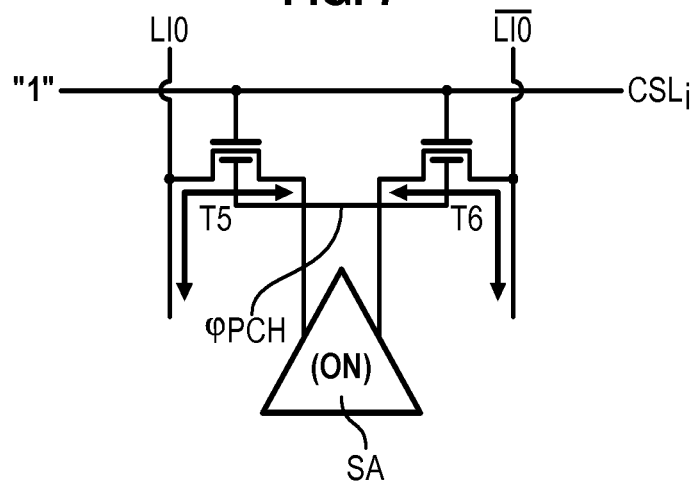

FIGS. 5-7 show the method of operating the sense amplifier according to the first aspect of the invention to perform the operations of precharge, sense and decode.

FIG. 5 shows the precharge operation during which the precharche control signal $\phi_{PCH}$ is set to a ON state (for instance at a high state Vdd, by means of a positive voltage in case of Nchannel transistors) so as to turn the transistors T5, T6 of the precharche and decode circuit PDC into depletion mode. Transistors T5, T6 therefore remain conducting (ON state), independent of the decoding signal CSL signal applied to their first gate. As the sense circuit is OFF during the precharge operation, the data lines LIO, $\overline{LIO}$ therefore provide their voltage level to the bit lines so as to precharge them.

FIG. 6 shows the sense operation during which the precharge control signal $\phi_{PCH}$ is set to the OFF state (for instance at a low state GND in the case of Nchannel transistors) so as to turn the transistors T5, T6 of the precharche and decode circuit PDC back into enhancement mode with respect to the state of the first gates of these transistors operated by the decoding control signal CSL. As long as the decoding signal CSL remains at the OFF state (for instance at low state GND in case of Nchannel transistors), transistors T5 and T6 are blocked (OFF state) and the sense circuit SC can proceed to a read/refresh operation and provide an output indicative of the data stored in the memory cell.

FIG. 7 shows the decode operation during which, while the precharge control signal $\phi_{PCH}$ remains at the OFF state, the decoding signal CSL is turned to the ON state (for instance at high state Vdd in case of N channel transistors) which turns ON transistors T5 and T6. The output provided by the sense circuit SC is therefore transferred to the data lines LIO, $\overline{LIO}$.

It will be appreciated that the invention proves advantageous in that a local X-Y decode can be performed by simply crossing the first and second gate lines, without particular layout constraint (no extra transistor as the decoding function requires no dedicated transistor) and without area penalty. Further, as compared to the decoder solutions described in introduction, the pitched sense amplifier layer is kept regular as it does not require extra devices.

It will be appreciated that the invention can be implemented on all technologies: bulk, PDSOI (Partially Depleted Silicon On Insulator), FDSOI (Fully Depleted Silicon On Insulator), as well as with FinFETs and other types of independent double gate transistors. FDSOI proves advantageous it that it enhances the advantages as it allows smaller area per functionality than bulk.

It will further be appreciated that the invention is not limited to the sense amplifier according to its first aspect, but rather also encompasses a semiconductor memory, in particular a DRAM memory, comprising at least one array of memory cells arranged in rows and columns and at least one sense amplifier according to its first aspect. The invention also relates to the method of operating the sense amplifier according to its first aspect as illustrated by FIGS. 5-7.

The invention claimed is:

1. A sense amplifier for sensing and amplifying data stored in a memory cell, the sense amplifier being connected between a bit line (BL) and a reference bit line ($\overline{BL}$) complementary to the first bit line and comprising:
   a sense circuit (SC) capable of providing an output indicative of the data stored in the memory cell; and
   a precharge and decode circuit (PDC) comprising a pair of dual gate transistors (T5, T6) for precharging the first and second bit lines during a precharge operation and for transferring the output provided by the sense circuit to a data line during a read operation,
wherein each dual gate transistor of the precharge and decode circuit has a first gate and a second gate, the first gates of the dual gate transistors being both controlled by a decoding control signal and the second gates of the dual gate transistors being both controlled by a precharge control signal.

2. The sense amplifier of claim 1, wherein each dual gate transistor is capable of working in either depletion or enhancement mode with respect to the state of the first gate of the transistor controlled by the decoding control signal depending on the state of the second gate of the transistor controlled precharge control signal.

3. The sense amplifier of claim 2, wherein each dual gate transistor is capable of working in depletion mode when the precharge control signal is at a ON state, and capable of working in enhancement mode when the precharge control signal is at a OFF state.

4. The sense amplifier according to claim 1 made on a semiconductor-on-insulator substrate comprising a thin layer of semiconducting material separated from a substrate by an insulating layer, wherein the dual gate transistors each comprise a first and a second gate, one of which is a back gate formed in the substrate below the insulating layer.

5. The sense amplifier of claim 4, wherein the second gate of each dual gate transistor is a back gate formed in the substrate below the insulating layer.

6. The sense amplifier according to claim 1, wherein each dual gate transistor is a Fin-type independent double gate transistor.

7. The sense amplifier according to claim 1, wherein each dual gate transistor is made of two single gate transistors arranged in parallel.

8. The sense amplifier according to claim 1, wherein the precharge and decode circuit (PDC) comprises a single pair of dual gate transistors (T5, T6).

9. The sense amplifier according to claim 1, wherein each dual gate transistor is arranged in series between one of the bit line and the reference bit line and a corresponding one of a first and a second data lines.

10. The sense amplifier of claim 9 made on a semiconductor-on-insulator substrate comprising a thin layer of semiconducting material separated from a substrate by an insulating layer, wherein the sense circuit comprises a pair of cross-coupled inverters arranged between the first and second bit lines, and wherein the cross-coupled inverters comprises dual gate transistors each having a first and a second gate, one of which is a back gate formed in the substrate below the insulating layer.

11. The sense amplifier of claim 10, wherein the sense circuit consists in the pair of cross-coupled inverters and in a further equalization transistor.

12. A semiconductor memory comprising at least one array of memory cells arranged in rows and columns and at least one sense amplifier according to claim 1.

13. The semiconductor memory of claim 12, wherein the first gates of the dual gate transistors are connected to a decoding line on which runs the decoding control signal and the second gates of the dual gate transistors are connected to a precharge line on which runs the precharge control signal, and wherein the decoding line and the precharge line are arranged perpendicular to each other, with for instance the decoding line arranged in the bit line direction of the memory cells array and the precharge line arranged in the direction perpendicular to the bit line direction.

14. A method of operating a sense amplifier according to claim 3 comprising the steps of:
    setting the precharge control signal at the ON state to perform the precharge operation;
    setting the precharge control signal at the OFF state and sensing the data stored in the memory cell with the sense circuit;
    setting the decoding control signal at the high state to perform the read operation.

* * * * *